(12) United States Patent
Sakuragi

(10) Patent No.: US 9,635,297 B2
(45) Date of Patent: Apr. 25, 2017

(54) IMAGE CAPTURING APPARATUS, SOLID-STATE IMAGE SENSOR, AND CAMERA THAT MAY SUPPRESS ELECTRICAL INTERFERENCE

(71) Applicant: CANON KABUSHIKI KAISHA, Tokyo (JP)

(72) Inventor: Takamasa Sakuragi, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 105 days.

(21) Appl. No.: 14/505,643

(22) Filed: Oct. 3, 2014

(65) Prior Publication Data

US 2015/0109504 A1   Apr. 23, 2015

(30) Foreign Application Priority Data

Oct. 22, 2013   (JP) .................................. 2013-219507

(51) Int. Cl.
*H04N 5/378*    (2011.01)
*H04N 5/357*    (2011.01)
*H01L 27/146*   (2006.01)

(52) U.S. Cl.
CPC ....... *H04N 5/378* (2013.01); *H01L 27/14634* (2013.01); *H01L 27/14636* (2013.01); *H01L 2224/48091* (2013.01); *H04N 5/3577* (2013.01)

(58) Field of Classification Search
CPC .... H04N 5/3575; H04N 5/378; H04N 5/3577; H01L 27/14634; H01L 27/14636
See application file for complete search history.

(56) References Cited

U.S. PATENT DOCUMENTS

| 4,918,521 | A | * | 4/1990 | Yabe | .................. | A61B 1/00179 |
| | | | | | | 348/373 |
| 7,023,482 | B2 | | 4/2006 | Sakuragi | | |
| 7,759,709 | B2 | | 7/2010 | Shibata et al. | | |
| 8,278,613 | B2 | | 10/2012 | Okita et al. | | |

(Continued)

FOREIGN PATENT DOCUMENTS

| JP | H09-092805 A | 4/1997 |
| JP | 2006-019536 A | 1/2006 |

(Continued)

OTHER PUBLICATIONS

Takamasa Sakuragi, U.S. Appl. No. 14/506,767, Oct. 6, 2014.

*Primary Examiner* — Christopher K Peterson
(74) *Attorney, Agent, or Firm* — Fitzpatrick, Cella, Harper & Scinto

(57) ABSTRACT

An image capturing apparatus includes a solid-state image sensor, a support member for the sensor, and electrically conductive members. The conductive members are electrically connected to the sensor, attached to support member, and arranged in a direction along one side of the sensor. The sensor is configured to receive a power supply voltage via a first conductive member, receive a ground voltage via a second conductive member, and transmit a signal via a third conductive member. The first and second conductive members are located on one side in the direction with respect to the third conductive member. The conductive members do not include a conductive member configured to supply a power supply voltage or a ground voltage to the sensor on the other side of the direction with respect to the third conductive member.

13 Claims, 6 Drawing Sheets

(56) References Cited

U.S. PATENT DOCUMENTS

| | | |
|---|---|---|
| 8,638,384 B2 | 1/2014 | Sakuragi |
| 8,884,864 B2 | 11/2014 | Sakuragi |
| 2006/0220673 A1* | 10/2006 | Hiranuma ............. H01L 23/498 326/27 |
| 2010/0230730 A1 | 9/2010 | Shibata et al. |
| 2012/0043454 A1 | 2/2012 | Sakuragi |

FOREIGN PATENT DOCUMENTS

| | | |
|---|---|---|
| JP | 2009-181976 A | 8/2009 |
| JP | 2013-247205 A | 12/2013 |

\* cited by examiner

FIG. 10

| TERMINAL NUMBER | TYPE |
|---|---|
| 1 | ANALOG OUTPUT SIGNAL |
| 2 | ANALOG OUTPUT SIGNAL |
| 3 | ANALOG OUTPUT SIGNAL |
| 4 | ANALOG OUTPUT SIGNAL |
| 5 | REFERENCE SIGNAL |
| 6 | POWER SUPPLY VOLTAGE |
| 7 | GROUND VOLTAGE |
| 8 | DUMMY |
| 9 | DUMMY |
| 10 | DUMMY |
| 11 | POWER SUPPLY VOLTAGE |
| 12 | REFERENCE SIGNAL |
| 13 | REFERENCE SIGNAL |
| 14 | REFERENCE SIGNAL |
| 15 | REFERENCE SIGNAL |
| 16 | DIGITAL INPUT SIGNAL |
| 17 | DIGITAL INPUT SIGNAL |
| 18 | DIGITAL INPUT SIGNAL |
| 19 | GROUND VOLTAGE |
| 20 | GROUND VOLTAGE |
| 21 | POWER SUPPLY VOLTAGE |
| 22 | DIGITAL INPUT SIGNAL |
| 23 | DIGITAL INPUT SIGNAL |
| 24 | DIGITAL INPUT SIGNAL |
| 25 | DIGITAL INPUT SIGNAL |
| 26 | DUMMY |
| 27 | REFERENCE SIGNAL |
| 28 | POWER SUPPLY VOLTAGE |
| 29 | DUMMY |
| 30 | DUMMY |
| 31 | DUMMY |
| 32 | GROUND VOLTAGE |
| 33 | POWER SUPPLY VOLTAGE |
| 34 | REFERENCE SIGNAL |
| 35 | ANALOG OUTPUT SIGNAL |
| 36 | ANALOG OUTPUT SIGNAL |
| 37 | ANALOG OUTPUT SIGNAL |
| 38 | ANALOG OUTPUT SIGNAL |

IMAGE CAPTURING APPARATUS, SOLID-STATE IMAGE SENSOR, AND CAMERA THAT MAY SUPPRESS ELECTRICAL INTERFERENCE

BACKGROUND OF THE INVENTION

Field of the Invention

The present invention relates to an image capturing apparatus, a solid-state image sensor, and a camera.

Description of the Related Art

Japanese Patent Laid-Open No. 2006-19536 proposes an image capturing apparatus in which a solid-state image sensor is mounted on a package. With this image capturing apparatus, in order to suppress an increase in the size of a mounting board mounting the image capturing apparatus, a connection terminal that is connected to an output amplifier of the solid-state image sensor is arranged in a corner of the solid-state image sensor, and the connection terminal is electrically connected to a pin arranged in a corner of the package.

SUMMARY OF THE INVENTION

As will be described below, depending on the arrangement of electrode pads on the solid-state image sensor, the quality of the image output by the image capturing apparatus decreases in some cases due to electrical interference between electrically conductive members inside of the image capturing apparatus. With the image capturing apparatus disclosed in Japanese Patent Laid-Open No. 2006-19536, there is no proposal regarding a configuration for suppressing this kind of interference. Some embodiments of the present invention provide a technique for suppressing electrical interference between electrically conductive members inside of an image capturing apparatus.

According to some embodiments, an image capturing apparatus comprises: a solid-state image sensor; a support member configured to support the solid-state image sensor; and a plurality of electrically conductive members that are electrically connected to the solid-state image sensor, the plurality of electrically conductive members being attached to the support member and arranged in a direction along one side of the solid-state image sensor, the plurality of electrically conductive members including a first electrically conductive member, a second electrically conductive member, and a third electrically conductive member, wherein the solid-state image sensor is configured to receive a power supply voltage via the first electrically conductive member, receive a ground voltage via the second electrically conductive member, and transmit a signal via the third electrically conductive member, and the first electrically conductive member and the second electrically conductive member are located on one side in the direction with respect to the third electrically conductive member, and the plurality of electrically conductive members do not include an electrically conductive member configured to supply a power supply voltage to the solid-state image sensor and an electrically conductive member configured to supply a ground voltage to the solid-state image sensor on the other side in the direction with respect to the third electrically conductive member.

According to some other embodiments, a solid-state image sensor comprises a plurality of electrode pads that are provided in a direction along one side of the solid-state image sensor, the plurality of electrode pads including a first electrode pad, a second electrode pad, and a third electrode pad, wherein the solid-state image sensor is configured to receive a power supply voltage via the first electrode pad, receive a ground voltage via the second electrode pad, and transmit an analog signal via the third electrode pad, and the first electrode pad and the second electrode pad are located on one side in the direction with respect to the third electrode pad, and the plurality of electrode pads do not include an electrode pad configured to supply a power supply voltage to the solid-state image sensor and an electrode pad configured to supply a ground voltage to the solid-state image sensor on the other side in the direction with respect to the third electrode pad.

Further features of the present invention will become apparent from the following description of exemplary embodiments with reference to the attached drawings.

BRIEF DESCRIPTION OF THE DRAWINGS

FIG. 10 is a diagram illustrating a pin arrangement of the image capturing apparatus according to some embodiments.

DESCRIPTION OF THE EMBODIMENTS

Figure 1:
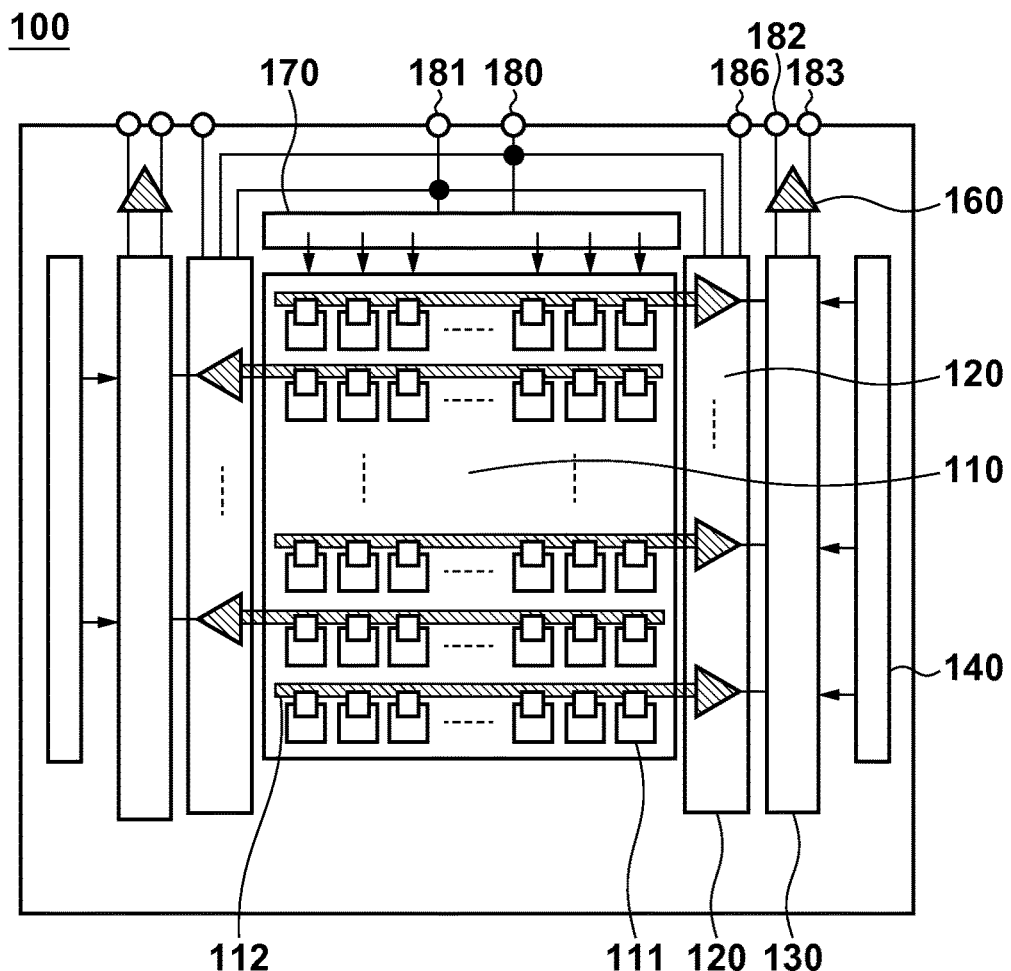
FIG. 1 is a diagram illustrating an exemplary configuration of a solid-state image sensor according to some embodiments.

Embodiments of the present invention will be described hereinafter with reference to the accompanying drawings. Similar elements are denoted by the same reference numerals throughout the various embodiments, and redundant description is omitted. Also, it is possible to appropriately modify and combine the embodiments. The embodiments below will be described in the context of a solid-state image sensor such as a CCD or a CMOS, and an image capturing apparatus including the solid-state image sensor.

An exemplary circuit configuration of a solid-state image sensor 100 according to some embodiments will be described below with reference to FIG. 1. The solid-state image sensor 100 is not limited to the configuration in FIG. 1, and any configuration that outputs an image signal corresponding to incident light on the solid-state image sensor 100 is possible. The solid-state image sensor 100 includes the components shown in FIG. 1, for example. A pixel unit 110 includes multiple pixels 111, and the pixels 111 are arranged in an array. Pixels 111 that are aligned in a row in the row direction (the left-right direction in FIG. 1) are all connected to one signal line 112. The signal line 112 is connected to a readout circuit unit 120 that is adjacent to the pixel unit 110. Signals from the pixel unit 110 are read out to the readout circuit unit 120 via the signal line 112. The readout circuit unit 120 has a column amplification circuit that amplifies signals from the pixels 111, a memory that stores signals amplified by the column amplifying circuit, and the like, for example. Reference signals are supplied from an electrode pad 186 to the readout circuit unit 120. The reference signals are used in the processing performed by the readout circuit unit 120, and, for example, are supplied to one input terminal of a comparator of the readout circuit unit 120. Signals output by the readout circuit unit 120 are transferred to an amplification unit 160 via a signal wiring unit 130. The amplification unit 160 amplifies the signals from the signal wiring unit 130 and outputs them as dual differential analog signals from the electrode pads 182 and 183.

The operation of the pixels 111 is controlled by pulse signals supplied by a vertical scanning circuit unit 170, and a signals are read out sequentially to the readout circuit unit 120 for each pixel 111 aligned in the column direction (the up-down direction in FIG. 1). Also, the operation of the signal wiring unit 130 is controlled using pulse signals output by a horizontal scanning circuit unit 140, and signals from the signal lines 112 are transferred sequentially to the amplification unit 160. In the solid-state image sensor 100, the pixel unit 110, the readout circuit unit 120, the signal wiring unit 130, and the amplification unit 160 are analog circuits that output analog signals, and the horizontal scanning circuit unit 140 and the vertical scanning circuit unit 170 are digital circuits that output digital signals. The circuits formed in the solid-state image sensor 100 will be referred to collectively as image capturing circuits.

In the solid-state image sensor 100, the circuit configuration including the readout circuit unit 120, the signal wiring unit 130, the amplification unit 160, and the horizontal scanning circuit unit 140 is provided on the left and right side of the pixel unit 110. The circuit configuration on the right side of the pixel unit 110 processes signals from pixels 111 that are located in odd-numbered rows, and the circuit configuration on the left side of the pixel unit 110 processes signals from pixels 111 that are located in even-numbered rows.

A power supply voltage is received at the electrode pad 180, and a ground voltage is received at the electrode pad 181. Alternatively, the ground voltage may be received at the electrode pad 180 and the power supply voltage may be received at the electrode pad 181. The power supply voltage and the ground voltage supplied to the electrode pads 180 and 181 are supplied to the pixel unit 110 (wiring to the pixel unit 110 is not shown), the readout circuit unit 120, and the vertical scanning circuit unit 170 via wiring formed on a semiconductor substrate of the solid-state image sensor 100.

Figure 2:
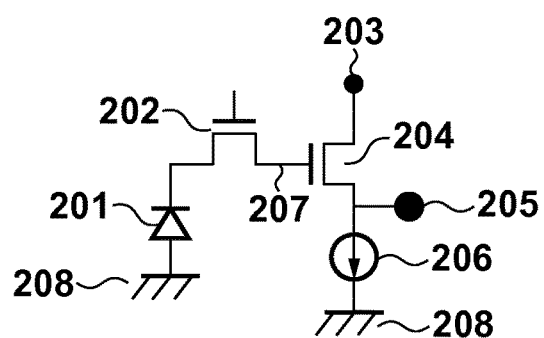
FIG. 2 is a diagram illustrating an exemplary configuration of a pixel according to some embodiments.

An exemplary circuit configuration of a pixel 111 in FIG. 1 will be described next with reference to FIG. 2. The pixel 111 is not limited to the configuration in FIG. 2, and any configuration in which a signal corresponding to incident light on the pixel 111 can be output may be used. The pixel 111 includes the components shown in FIG. 2, for example. A photoelectric conversion element 201 (e.g., a photodiode) generates an electric charge that corresponds to the incident light. The electric charge generated by the photoelectric conversion element 201 is transferred to a floating diffusion region 207 by a transfer MOS transistor 202. An amplification MOS transistor 204 outputs a signal obtained by amplifying the voltage of the floating diffusion region 207 to an output node 205. The output node 205 is connected to the signal line 112. One main electrode of the amplification MOS transistor 204 is connected to a power supply node 203, and the other main electrode is connected to a current supply 206 that supplies a bias current. The power supply node 203 is electrically connected to the electrode pad 180 via the power supply line, and a ground node 208 is electrically connected to the electrode pad 181 via the semiconductor substrate and the wiring.

Figure 3:
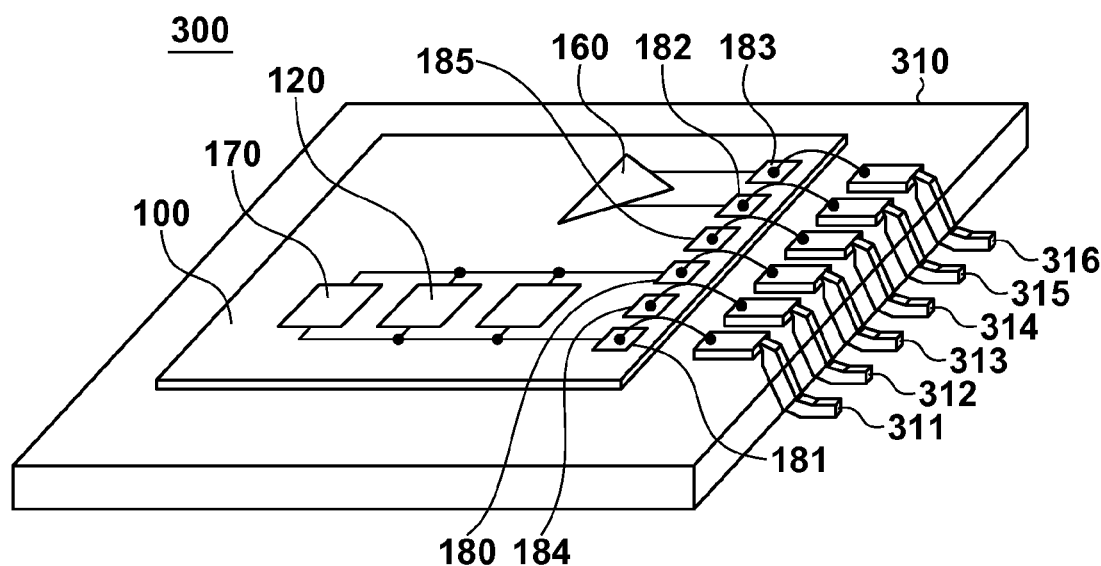
FIG. 3 is a diagram illustrating an exemplary configuration of an image capturing apparatus according to some embodiments.

An exemplary configuration of an image capturing apparatus 300 according to some embodiments will be described next with reference to FIG. 3. The image capturing apparatus 300 includes the solid-state image sensor 100 of FIG. 1 and a package on which the solid-state image sensor 100 is mounted. In FIG. 3, a portion of the components of the solid-state image sensor 100, which was described in FIG. 1, have been omitted. The package has a substrate 310 for supporting the solid-state image sensor 100, and pins 311 to 316 that are attached to the substrate 310. The substrate 310 is a support member that supports the solid-state image sensor 100. Bonding wires are attached to the electrode pads 180 to 185 and the pins 311 to 316 of the solid-state image sensor 100. The electrode pads 180 to 185 and the pins 311 to 316 of the solid-state image sensor 100 are connected by the bonding wires. In the example shown in FIG. 3, the electrode pads 180 to 185 and the pins 311 to 316 that are at corresponding positions (i.e., in the same order starting from the end) are connected such that the bonding wires do not intersect each other. The package may further include a sealing member for sealing the solid-state image sensor 100 and the bonding wires, although this is not shown in the drawing. In such a case, the support member that supports the solid-state image sensor 100 is formed by the substrate 310 and the sealing member. The pins 311 to 316 that are aligned in a line along one side of the solid-state image sensor 100 will be referred to collectively as a pin group. The example shown in FIG. 3 indicates that the electrode pads and pins are arranged on only one side of the solid-state image sensor 100 and the substrate 310, but the electrode pads and pins may be arranged on another side of the solid-state image sensor 100 and the substrate 310 as well. That is to say, the solid-state image sensor 100 can have multiple pin groups. Furthermore, electrode pads and pins having the same functions as the electrode pads 180 to 185 and the pins 311 to 316 may be arranged on multiple sides.

If the image capturing apparatus 300 is mounted in an image capturing system such as a camera, the pin 311 and the pin 313 are electrically connected to a power supply apparatus (not shown) of the image capturing system. The power supply voltage is supplied from the power supply apparatus to the solid-state image sensor 100 via the pin 311, the bonding wire, and the electrode pad 181, and the ground voltage is supplied to the solid-state image sensor 100 via the pin 313, the bonding wire, and the electrode pad 180.

As described above, if the pins 311 and 313 are electrically connected to the power supply apparatus of an image capturing system, a closed circuit is formed by an image capturing circuit (e.g., the readout circuit unit 120), the power supply apparatus, and electrically conductive members (e.g., a pin and a bonding wire) connecting those elements. The closed circuit including the power supply apparatus will be referred to as "power supply closed circuit" below. If the value for the current that flows in the power supply closed circuit changes over time, a magnetic field is generated in the periphery of the closed circuit. In particular, a case will be considered in which the power supply closed circuit includes a digital circuit (e.g., the readout circuit unit 120), as shown in FIG. 3. A transient current flows in the digital circuit accompanying a switching operation at the time when the digital circuit generates a pulse signal. The transient current includes a high-frequency component and has a large peak value, and therefore the current change rate per unit time (A/ns) for the current that flows in the power supply closed circuit sometimes reaches an extremely large value. In accordance with such a large current change rate, the magnetic field generated in the periphery of the power supply closed circuit becomes stronger. Also, the larger the number of digital circuits included in the power supply closed circuit is, the stronger the magnetic field generated in the periphery of the power supply closed circuit is. There are cases where this strong magnetic field has an influence on signals flowing in other electrically conductive members (e.g., bonding wires or pins) of the image capturing apparatus 300.

An example of an electrically conductive member that is influenced by the magnetic field generated by the power supply closed circuit will be described below. If the image capturing apparatus 300 is mounted in an image capturing system such as a camera, the pin 315 and the pin 316 are electrically connected to an AD conversion circuit (not shown) of the image capturing system. The differential analog signal output from the amplification unit 160 of the solid-state image sensor 100 is transmitted to the AD conversion circuit via the electrode pad 182, the bonding wire, and the pin 315, and the electrode pad 183, the bonding wire, and the pin 316. In this case, a closed circuit is formed by the amplification unit 160, the AD conversion circuit, and the electrically conductive members (e.g., the pins 315 and 316, and the bonding wires connected thereto) connecting the amplification unit 160 and the AD conversion circuit. Hereinafter, the closed circuit including the amplification unit 160 will be referred to as "analog closed circuit". If the magnetic field that is interlinked with the analog closed circuit changes over time, a voltage determined using the following equation is generated in the analog closed circuit by means of electromagnetic induction.

$V = \iint (dB/dt) \cdot ds$ (B is magnetic flux density, t is time, $\iint ds$ is a surface integral) Due to the influence of the electric field, noise appears in the analog signal that is transmitted by the analog closed circuit. Since the amplification unit 160 outputs the pixel signals read out from the pixels 111, noise is superposed on the image signal and the quality of the image obtained by the image capturing apparatus 300 decreases.

In view of this, the electrode pads on the solid-state image sensor 100, the pins on the package, and bonding wires are arranged such that the power supply closed circuit and the analog closed circuit are located away from each other in the solid-state image sensor 100 of FIG. 3. In other words, the electrode pads for analog output on the solid-state image sensor 100, the pins on the package, and bonding wires are arranged so as to not be interlinked with the power supply closed circuit. A specific example of this kind of arrangement will be described below.

A first arrangement example will be described below. First, the electrode pad 180 and the electrode pad 181 are separated by a distance De. Here, the distance between two electrode pads is defined as the distance between the centers of the electrode pads, for example. Alternatively, the distance between two electrode pads may be defined as the shortest distance between the two electrode pads. Also, the distance between two electrode pads may be defined using a different method. The electrode pads 180 to 183 are arranged such that the electrode pads 182 and 183 that are included in the analog closed circuit are located De or more (the distance between the electrode pads 180 and 181 or more) away from the electrode pad 180, and are located De or more away from the electrode pad 181. According to this, the electrode pad 180 and the electrode pad 181 are located on one side with respect to the electrode pads 182 and 183, in the alignment direction of the electrode pads 180 to 185 that form the electrode pad group. Also, the electrode pad 180 and the electrode pad 181 are not located on the other side with respect to the electrode pads 182 and 183, in the alignment direction of the electrode pads 180 to 185 that form the electrode pad group. In the present example, no electrode pads are located on the other side with respect to the electrode pads 182 and 183. However, an electrode pad other than the electrode pad 180 and the electrode pad 181 that is not a part of the power supply closed circuit may be arranged on the other side with respect to the electrode pads 182 and 183.

A second arrangement example will be described next. First, the bonding wire that is electrically connected to the electrode pad 180 and the bonding wire that is connected to the electrode pad 181 are separated by a distance Db. Here, the distance between two bonding wires is defined as the shortest distance between the two bonding wires, for example. Also, the distance between two bonding wires may be defined using a different method. Then, the bonding wires are arranged such that the two bonding wires included in the analog closed circuit are both located Db or more away from the bonding wire that is electrically connected to the electrode pad 180. Furthermore, the bonding wires are arranged such that the two bonding wires included in the analog closed circuit are both located Db or more away from the bonding wire that is electrically connected to the electrode pad 181. Accordingly, the bonding wires that are connected to the electrode pad 180 and the electrode pad 181 are arranged on one side with respect to the bonding wires that are connected to the electrode pads 182 and 183 in the alignment direction of the bonding wires. Also, the bonding wires that are connected to the electrode pad 180 and the electrode pad 181 are not arranged on the other side with respect to the bonding wires that are connected to the electrode pads 182 and 183 in the alignment direction of the bonding wires. In the present example, no bonding wires are located on the other side with respect to the bonding wires that are connected to the electrode pads 182 and 183. However, a bonding wire that is connected to an electrode pad other than the electrode pad 180 and the electrode pad 181 that is not part of the power supply closed circuit may be arranged on the other side with respect to the bonding wires that are connected to the electrode pads 182 and 183.

A third arrangement example will be described next. First, the pin 313 that is electrically connected to the electrode pad 180 and the pin 311 that is connected to the electrode pad 181 are separated by a distance Dp. Here, the distance between two pins is defined as the shortest distance between the two pins, for example. Also, the distance between two pins may be defined using a different method. Also, the pins 311, 313, 315, and 316 are arranged such that the two pins 315 and 316 that are included in the analog closed circuit are located at least Dp away from the pin 311 and are located at least Dp away from the pin 313. Accordingly, the pin 311 and the pin 313 are located on one side with respect to the pins 315 and 316 in the alignment direction of the pins 311 to 316. Also, the pins 312 and 314 are not located on the other side of the pins 315 and 316 in the alignment direction of the pins 311 to 316. In the present example, no pins are located on the other side with respect to the pins 315 and 316. However, a pin other than the pin 312 and the pin 314 that is not part of the power supply closed circuit may be arranged on the other side with respect to the pins 315 and 316.

Figure 4:
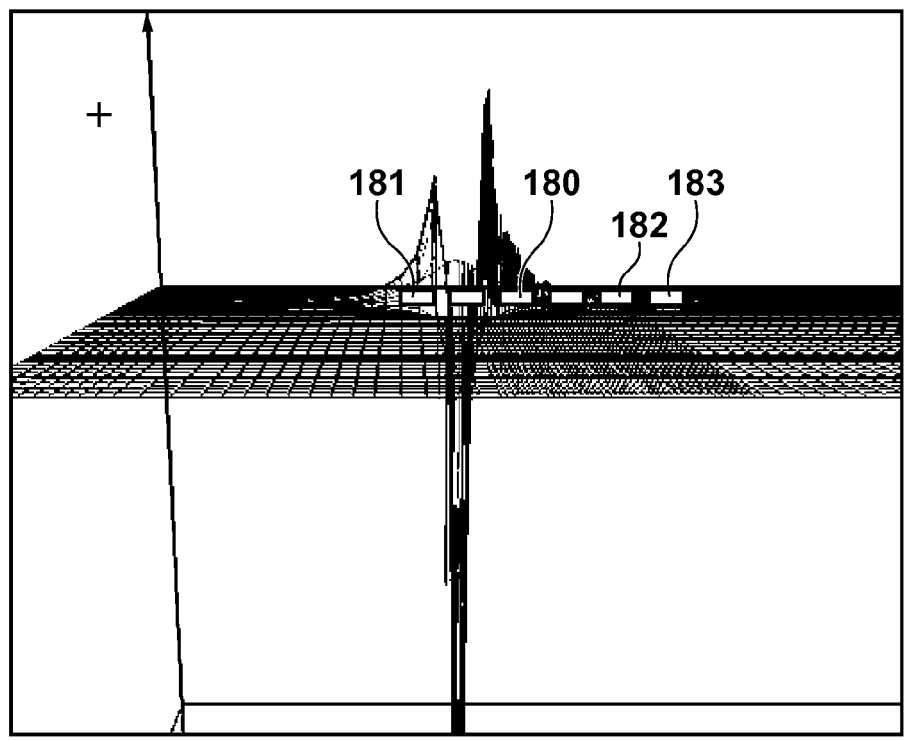
FIG. 4 is a diagram illustrating a magnetic field generated in the image capturing apparatus of FIG. 3.

An electrode pad, bonding wire, and pin that are mutually electrically connected will be collectively referred to as a "terminal". Here, a terminal is configured by three components, namely an electrode pad, a bonding wire, and a pin, but the configuration of a terminal is not limited thereto. It is possible to realize all of the above-described first to third arrangement examples at the same time, and it is possible to realize only a portion thereof. Even if only a portion is implemented, the influence of the power supply closed circuit on the analog closed circuit can be reduced accordingly. The magnetic field generated by the power supply closed circuit of the image capturing apparatus 300 will be described next with reference to FIG. 4. FIG. 4 shows the results of a simulation in which the strength of the magnetic field generated in locations along the surface of the solid-state image sensor 100 is measured using current that flows in the power supply closed circuit. The axis extending up and down indicates the strength of the magnetic field, which is 0 at intersections with the grid plane. As can be understood from viewing FIG. 4, the magnetic field generated by the power supply closed circuit is strong in the vicinity of and between the electrode pad 180 and the electrode pad 181, and weakens as it moves away from the electrode pad 180 and the electrode pad 181. As shown in FIG. 4, the power supply closed circuit has almost no influence at the locations of the electrode pads 182 and 183. Accordingly, with the above-described first arrangement example to the third arrangement example, noise that appears in the analog signal that flows in the analog closed circuit can be reduced, and a decrease in the quality of images generated by the image capturing apparatus 300 can be suppressed.

Among the terminals that supply the power supply voltage to the solid-state image sensor 100, the terminal including the electrode pad 180 and the pin 313 is arranged at the location that is separated by the shortest distance from the terminal including the electrode pad 182 and the pin 315 and the terminal including the electrode pad 183 and the pin 316. Similarly, among the terminals that supply the ground voltage to the solid-state image sensor 100, the terminal including the electrode pad 181 and the pin 311 is arranged at the location that is separated by the shortest distance from the terminal including the electrode pad 182 and the pin 315 and the terminal including the electrode pad 183 and the pin 316. Also, among the terminals that output signals from the solid-state image sensor 100, the terminal including the electrode pad 182 and the pin 315 is arranged at the location that is separated by the shortest distance from the terminal including the electrode pad 180 and the pin 313. Similarly, among the terminals that output signals from the solid-state image sensor 100, the terminal including the electrode pad 182 and the pin 315 is arranged at the location that is separated by the shortest distance from the terminal including the electrode pad 183 and the pin 316.

Figure 5:
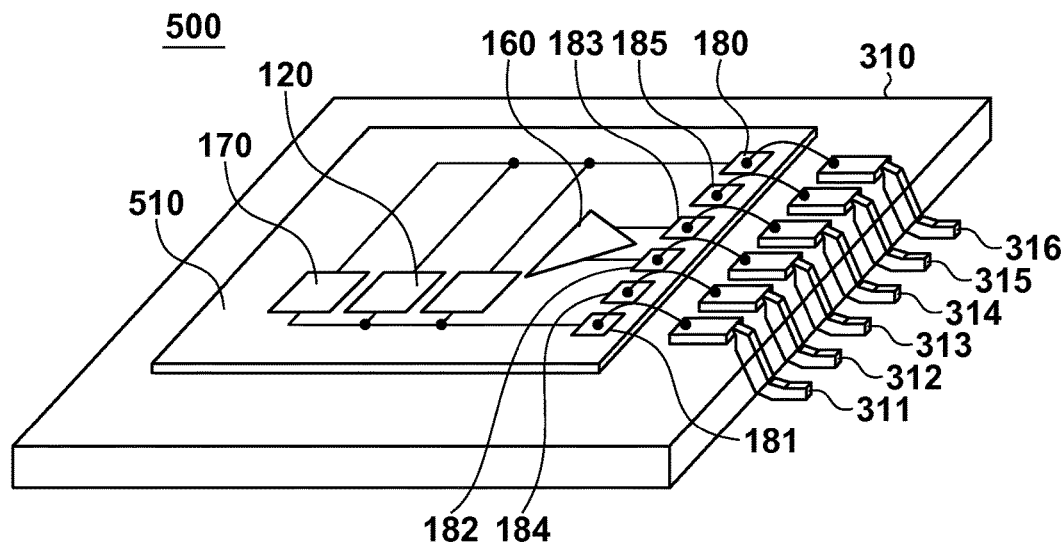
FIG. 5 is a diagram illustrating an exemplary configuration of an image capturing apparatus according to a comparative example.
Figure 6:
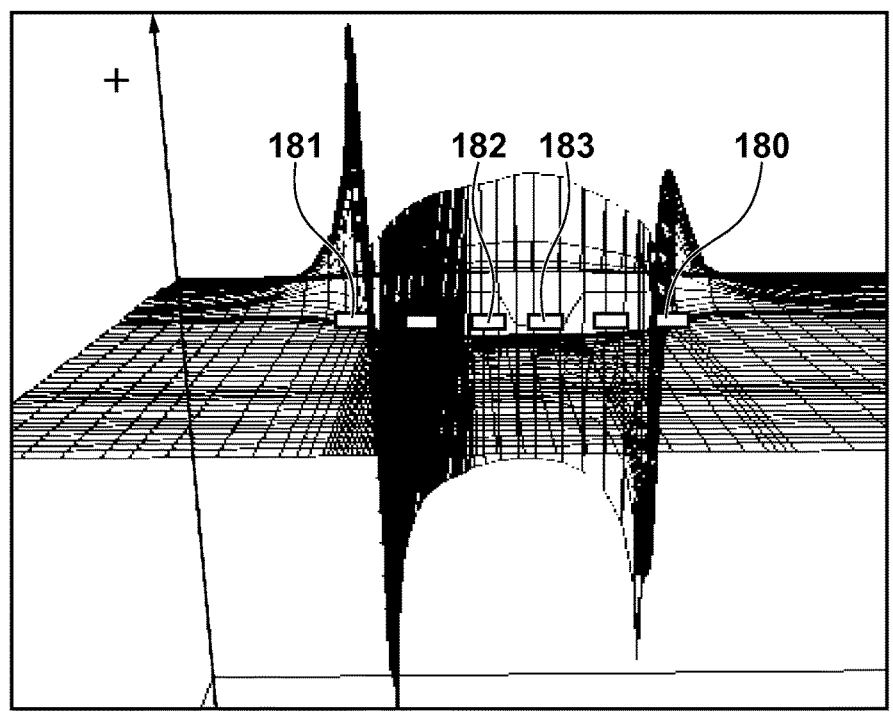
FIG. 6 is a diagram illustrating a magnetic field generated in the image capturing apparatus of FIG. 5.

A configuration of an image capturing apparatus 500 that is a comparative example will be described next with reference to FIG. 5. The image capturing apparatus 500 has components that are similar to those of the image capturing apparatus 300, but the positions of the electrode pads are different from those in the image capturing apparatus 300. In the example in FIG. 5, the electrode pads 182 and 183 that are included in the analog closed circuit are located between the electrode pads 180 and 181 that are included in the power supply closed circuit. The magnetic field generated by the power supply closed circuit of the image capturing apparatus 500 will be described next with reference to FIG. 6. FIG. 6 shows the results of a simulation in which the strength of the magnetic field generated in locations along the surface of the solid-state image sensor 510 is measured using current that flows in the power supply closed circuit. As shown in FIG. 6, it is understood that the magnetic field generated by the power supply closed circuit including the electrode pads 180 and 181 has an influence on the analog closed circuit that includes the electrode pads 182 and 183.

Other examples of electrically conductive members that are influenced by the magnetic field generated by the power supply closed circuit include an electrode pad 186 for inputting reference signals to the readout circuit unit 120 and the current setting circuit of the current bias circuit that is necessary for driving the image sensor, and the electrically conductive members that are connected to the electrode pad 186. Similarly to the electrode pad 182 and the electrically conductive members connected thereto, the electrode pad 186 and the electrically conductive members connected thereto may also be arranged as described above in the first to third arrangement examples. In general, electrode pads for transmitting analog signals and electrically conductive members connected to the electrode pads are not arranged near the power supply closed circuit since image quality will be reduced due to the influence of the magnetic field generated by the power supply closed circuit. Here, in the case of using an electrode pad as a reference, for example, "near the power supply closed circuit" means that the distance from the electrode pad 180 is less than De (less than the distance between the electrode pads 180 and 181) or the distance from the electrode pad 181 is less than De. Db and Dp can be used similarly to define the length with respect to the bonding wires and the pins as well. Note that the analog closed circuit may be arranged close to the electrode pads for supplying the power supply voltage and the ground voltage to the analog circuit since the current that flows in those electrode pads does not include high-frequency components.

In the example shown in FIG. 3, the analog closed circuit is arranged far from the power supply closed circuit in order to prevent image quality from decreasing due to the influence of the power supply closed circuit. In contrast to this, electrode pads for transmitting digital signals that are not easily influenced by the power supply closed circuit, and electrode pads for transmitting analog signals that have little influence on image quality may be arranged close to the power supply closed circuit. For example, the solid-state image sensor 100 may be configured such that signals that are not easily influenced by the power supply closed circuit are transmitted via an electrode pad 184 located between the electrode pad 180 and the electrode pad 181. Also, the solid-state image sensor 100 may be configured such that signals that are not easily influenced by the power supply closed circuit are transmitted via an electrode pad 185 whose distance from the electrode pad 180 is less than De. Alternatively, the voltage may be supplied via the electrode pads 184 and 185 to a circuit that generates a current that does not include high-frequency components.

Figure 7:
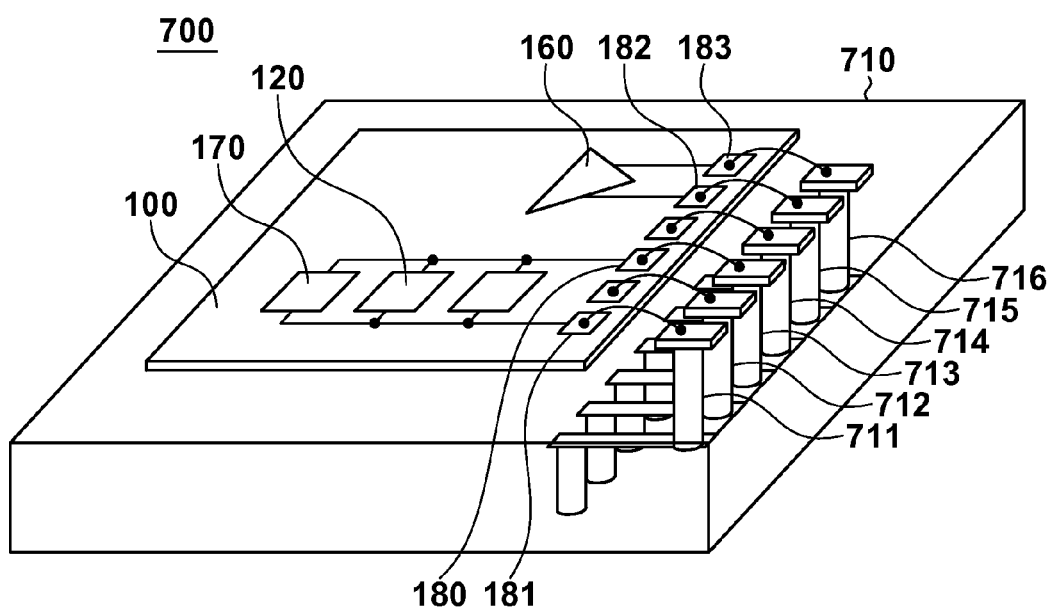
FIG. 7 is a diagram illustrating an exemplary configuration of the image capturing apparatus according to some embodiments.

An exemplary configuration of an image capturing apparatus 700 according to some embodiments will be described next with reference to FIG. 7. In the image capturing apparatus 700, the solid-state image sensor 100 in FIG. 1 is mounted on an LGA-type package. With the image capturing apparatus 700, the substrate 310 is replaced with a substrate 710 and the pins 311 to 316 are replaced with pins 711 to 716. The arrangement of the pins 711 to 716 is similar to the arrangement of the pins 311 to 316, and the arrangement of the bonding wires that are connected to the pins 711 to 716 is similar to the arrangement of the bonding wires that are connected to the pins 311 to 316. For this reason, redundant description thereof is omitted. The pins 711 to 716 are arranged in a line along the aliment direction, but they may be arranged in another manner.

Figure 8:
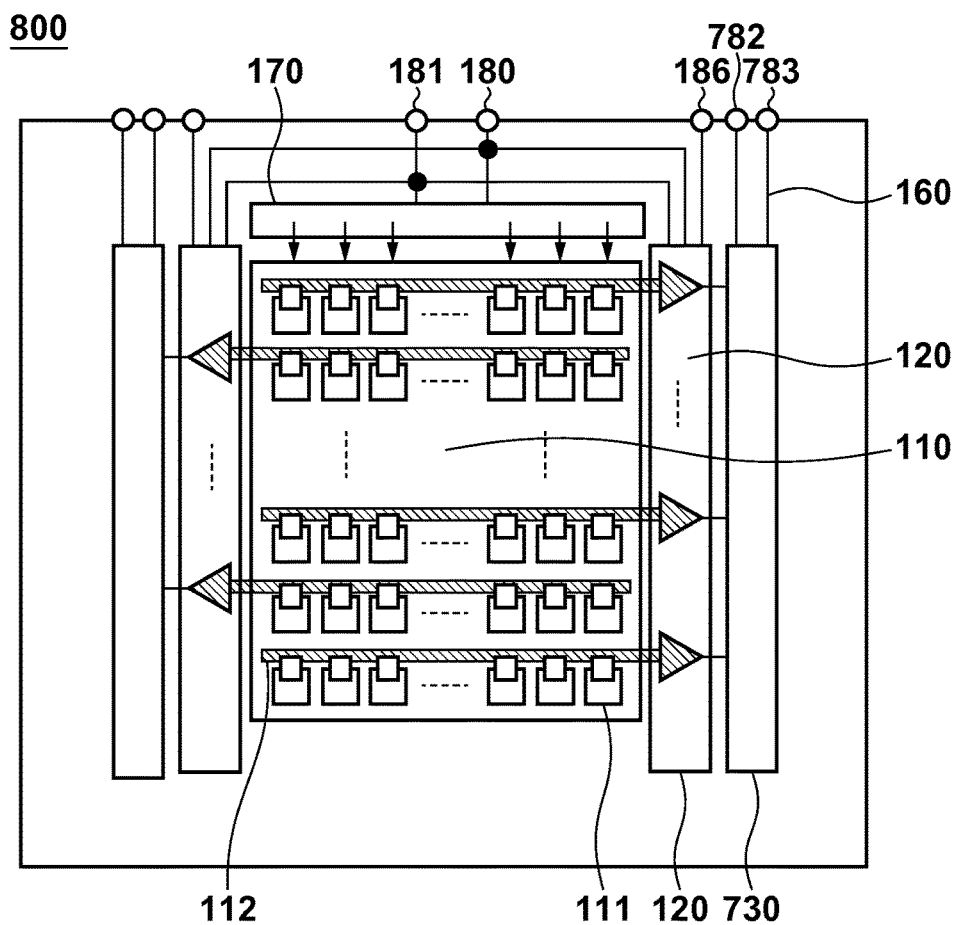
FIG. 8 is a diagram illustrating an exemplary configuration of the solid-state image sensor according to some embodiments.

An exemplary circuit configuration of a solid-state image sensor 800 according to some embodiments will be described next with reference to FIG. 8. The solid-state image sensor 800 includes the components shown in FIG. 8, for example. The solid-state image sensor 800 has an AD conversion circuit 730, and pixel signals output from the readout circuit unit 120 are subjected to AD conversion in the AD conversion circuit 730. The AD conversion circuit 730 is electrically connected to electrode pads 782 and 783. Reference signals for AD conversion are supplied from the electrode pad 782 and the ground voltage is supplied from the electrode pad 783. The AD conversion circuit is configured such that AD conversion is performed by comparing a reference signal and an imaging signal.

Figure 9:
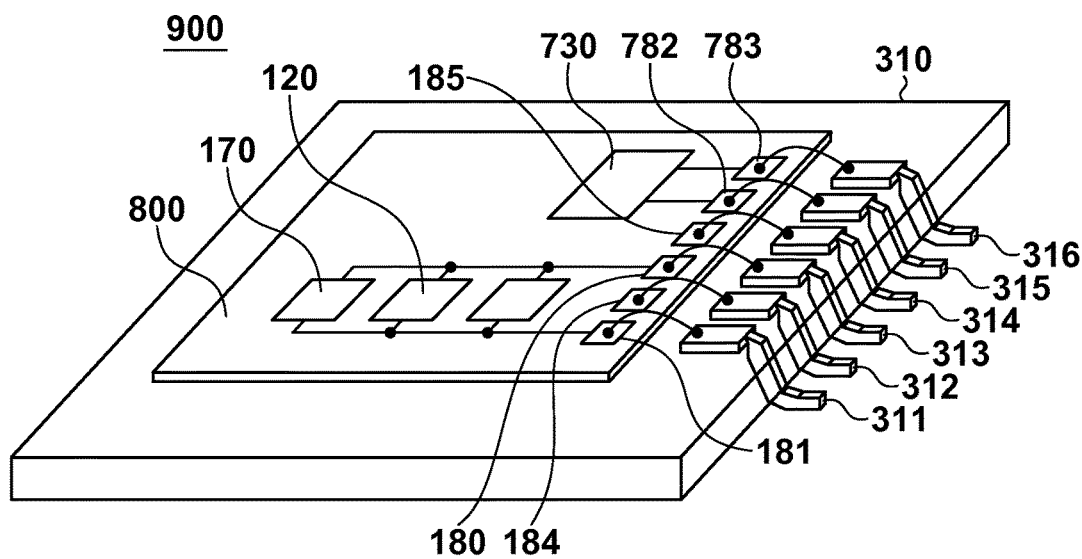
FIG. 9 is a diagram illustrating an exemplary configuration of the image capturing apparatus according to some embodiments.

An exemplary configuration of an image capturing apparatus 900 according to some embodiments will be described next with reference to FIG. 9. The image capturing apparatus 900 includes the solid-state image sensor 800 of FIG. 8 and a package on which the solid-state image sensor 800 is mounted. The package of the image capturing apparatus 300 and the package of the image capturing apparatus 900 may be the same. In the image capturing apparatus 900 as well, the electrode pads 782 and 783 for inputting analog signals, and electrically conductive members that are electrically connected to the electrode pads 782 and 783 are located far from electrode pads 180 and 181 and the electrically conductive members that are electrically connected to the electrode pads 180 and 181. Here, "located far from" means that the electrode pads and the electrically conductive members are located as described above in the first to third arrangement examples. If the voltage supplied to the AD conversion circuit 730 is influenced by the power supply closed circuit, a deviation appears in the value of the digital pixel value output by the AD conversion circuit 730. Because of this, the quality of the image output by the image capturing apparatus 900 decreases. With the image capturing apparatus 900 as well, it is possible to suppress a decrease in image quality by means of an arrangement that is similar to that described above.

A specific example of the arrangement of the terminals in the image capturing apparatus will be described next with reference to FIG. 10. The terminals shown in FIG. 10 are arranged in a direction along one side of an LGA package in an image capturing apparatus. Terminals not shown in FIG. 10 may be arranged on another side in the image capturing apparatus. It is assumed that the terminals shown in FIG. 10 are arranged with equal intervals therebetween. The solid-state image sensor mounted in the image capturing apparatus has the same number of electrode pads as terminals in the package, and the terminals and electrode pads are connected in a one-to-one correspondence by bonding wires. However, "dummy" terminals and corresponding electrode pads shown in FIG. 10 need not be connected by bonding wires. In the example of FIG. 10, adjacent "power supply voltages" and "ground voltages" configure power supply closed circuits. For example, a power supply closed circuit is configured by the "power supply voltage" of terminal number 6 and the "ground voltage" of terminal number 7. With the terminal arrangement shown in FIG. 10, "analog output signals" are located far from these kinds of power supply closed circuits.

As an example of an application of the image capturing apparatus according to the above embodiments, an illustrative description will be given hereinafter for a camera, which is an example of an image capturing system in which an image capturing apparatus is incorporated. The concept of a camera includes not only apparatuses whose main purpose is capturing images, but also apparatuses that supplementarily include an image capturing function (e.g., personal computers, portable terminals, and the like). A camera includes an image capturing apparatus according to the present invention that was described in the above embodiments, and a signal processing unit that processes signals output from the image capturing apparatus. The signal processing unit can include, for example, an AD conversion circuit, and a processor that processes digital data output from the AD conversion unit. The image capturing apparatus is mounted on a mounting board included in the camera, and pins in a package of the image capturing apparatus and electrodes on mounting board are soldered thereto.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-219507, filed Oct. 22, 2013, which is hereby incorporated by reference herein in its entirety.

What is claimed is:

1. An image capturing apparatus comprising:
   a solid-state image sensor;
   a support substrate configured to support the solid-state image sensor; and
   a plurality of electrical conductors that are electrically connected to the solid-state image sensor, the plurality of electrical conductors being attached to the support substrate and arranged in a direction along one side of the solid-state image sensor, the plurality of electrical conductors including a first electrical conductor, a second electrical conductor, a third electrical conductor, and a fourth electrical conductor,
   wherein the solid-state image sensor is configured to receive a power supply voltage via the first electrical conductor, receive a ground voltage via the second electrical conductor, and to output an analog signal via the third electrical conductor,
   wherein the first electrical conductor, and the second electrical conductor are located on one side in the direction with respect to the third electrical conductor, and the plurality of electrical conductors that do not include an electrical conductor configured to supply a power supply voltage to the solid-state image sensor and that do not include an electrical conductor configured to supply a ground voltage to the solid-state image sensor are located on the other side in the direction with respect to the third electrical conductor,
   wherein the fourth electrical conductor is located nearer to the first electrical conductor than the third electrical conductor is, and
   wherein the solid-state image sensor is configured such that a reference signal that is used in signal processing in the solid-state image sensor is input via the fourth electrical conductor.

2. The image capturing apparatus according to claim 1, wherein a distance between the first electrical conductor and the third electrical conductor is greater than or equal to a distance between the first electrical conductor and the second electrical conductor, and wherein a distance between the second electrical conductor and the third electrical conductor is greater than or equal to the distance between the first electrical conductor and the second electrical conductor.

3. The image capturing apparatus according to claim 1, wherein a distance between the first electrical conductor and the third electrical conductor is greater than a distance between the first electrical conductor and the second electrical conductor, and wherein a distance between the second electrical conductor and the third electrical conductor is greater than the distance between the first electrical conductor and the second electrical conductor.

4. The image capturing apparatus according to claim 1, wherein the plurality of electrical conductors do not include an electrical conductor that is configured to output a signal and that is located at a location that is separated from the first electrical conductor by less than the distance between the first electrical conductor and the second electrical conductor, and wherein the plurality of electrical conductors do not include an electrical conductor that is configured to output a signal and that is located at a location that is separated from the second electrical conductor by less than the distance between the first electrical conductor and the second electrical conductor.

5. The image capturing apparatus according to claim 1, wherein, among the electrical conductors that supply a power supply voltage to the solid-state image sensor, the first electrical conductor is arranged at a location that is separated from the third electrical conductor by the shortest distance.

6. The image capturing apparatus according to claim 1, wherein, among the electrical conductors that supply a ground voltage to the solid-state image sensor, the second electrical conductor is arranged at a location that is separated from the third electrical conductor by the shortest distance.

7. The image capturing apparatus according to claim 1, wherein the solid-state image sensor includes a digital circuit that is electrically connected to at least one of the first electrical conductor or the second electrical conductor.

8. The image capturing apparatus according to claim 1, wherein the solid-state image sensor and the support substrate are parallel to each other.

9. The image capturing apparatus according to claim 8, wherein the solid-state image sensor includes an AD conversion circuit configured to perform AD conversion by comparing the reference signal and an imaging signal.

10. The image capturing apparatus according to claim 1, wherein
the first electrical conductor includes a first bonding wire,
the second electrical conductor includes a second bonding wire,
the third electrical conductor includes a third bonding wire,
the distance between the first bonding wire and the third bonding wire is greater than or equal to the distance between the first bonding wire and the second bonding wire, and
the distance between the second bonding wire and the third bonding wire is greater than or equal to the distance between the first bonding wire and the second bonding wire.

11. The image capturing apparatus according to claim 1, wherein
the first electrical conductor includes a first pin,
the second electrical conductor includes a second pin,
the third electrical conductor includes a third pin,
the distance between the first pin and the third pin is greater than or equal to the distance between the first pin and the second pin, and
the distance between the second pin and the third pin is greater than or equal to the distance between the first pin and the second pin.

12. A camera comprising:
the image capturing apparatus according to claim 1; and
a signal processing unit configured to process a signal obtained by the image capturing apparatus.

13. A camera comprising:
the image capturing apparatus according to claim 1; and
a mounting board on which the image capturing apparatus is mounted.

* * * * *